United States Patent
Takano et al.

(10) Patent No.: US 7,357,839 B2
(45) Date of Patent: Apr. 15, 2008

(54) SOI WAFER AND A METHOD OF PRODUCING THE SAME

(75) Inventors: Kiyotaka Takano, Gunma (JP); Hitoshi Tsunoda, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 189 days.

(21) Appl. No.: 10/554,960

(22) PCT Filed: May 7, 2004

(86) PCT No.: PCT/JP2004/006514

§ 371 (c)(1),
(2), (4) Date: Oct. 28, 2005

(87) PCT Pub. No.: WO2004/102668

PCT Pub. Date: Nov. 25, 2004

(65) Prior Publication Data

US 2006/0246689 A1    Nov. 2, 2006

(30) Foreign Application Priority Data

May 15, 2003 (JP) .............................. 2003-137939

(51) Int. Cl.
*C30B 35/00* (2006.01)
*C03C 27/02* (2006.01)
(52) U.S. Cl. ..................... 117/200; 65/59.5; 65/85; 65/DIG. 8
(58) Field of Classification Search .......... 117/84, 117/89, 92, 200, 900; 428/446; 65/59.21, 65/59.5, 60.8, 85, DIG. 8
See application file for complete search history.

(56) References Cited

U.S. PATENT DOCUMENTS 6,335,231 B1    1/2002    Yamazaki et al.
2004/0032003 A1    2/2004    Ohmi et al.

FOREIGN PATENT DOCUMENTS

| JP | A 57-112074 | 7/1982 |
| JP | B2 5-46086 | 7/1993 |
| JP | A 11-307747 | 11/1999 |
| JP | B2 3048201 | 3/2000 |
| JP | A 2002-289819 | 10/2002 |

OTHER PUBLICATIONS

Saito et al., "Advantage of Radical Oxidation for Improving Reliability of Ultra-Thin Gate Oxide," Symposium on VLSI Technology Digest of Technical Papers, pp. 176-177, 2000.

*Primary Examiner*—Felisa Hiteshew
(74) *Attorney, Agent, or Firm*—Oliff & Berridge PLC

(57) ABSTRACT

The present invention provides an SOI wafer having at least an SOI layer, in which a plain orientation of the SOI layer is off-angled from {110} only in a direction to <100>, and an off-angle is from 5 minutes to 2 degrees, and a method of producing an SOI wafer comprising at least bonding a base wafer and a bond wafer consisting of a silicon single crystal, and forming an SOI layer by thinning the bond wafer, wherein the bond wafer is used where a plain orientation thereof is off-angled from {110} only in a direction to <100>, and an off-angle is from 5 minutes to 2 degrees. Thereby, there can be provided an SOI wafer having both high uniformity of film thickness and good micro-roughness to be suitable for fabricating high speed devices, and provided a method of producing the SOI wafer.

18 Claims, 4 Drawing Sheets

SOI WAFER AND A METHOD OF PRODUCING THE SAME

This application is a 371 of PCT/JP04/06514 May 7, 2004.

TECHNICAL FIELD

The present invention relates to an SOI (Silicon On Insulator) wafer which is a bonded SOI wafer where two wafers are bonded, wherein at least a plain orientation of an active layer (an SOI layer) to be formed with devices is off-angled from {110}, and relates to a method of producing it.

BACKGROUND ART

As a method of producing an SOI wafer, there is known a method to produce a bonded SOI wafer by bonding two silicon single crystal wafers, that is, a base wafer to be a base substrate and a bond wafer to be formed with an SOI layer, through a silicon oxide film. As steps of producing such a bonded wafer, for example, there is known a method to form an oxide film on a surface of at least one of two wafers to bring them into contact closely and mutually without foreign materials on the bonded surface, and thereafter to subject them to a heat treatment at a temperature of about 200-1200° C. to enhance bonding strength thereof (see, Japanese Patent Publication (Kokoku) No. 5-46086).

A bonded wafer of which the bonding strength is enhanced by the heat treatment as described above can be subjected to subsequent grinding and polishing process. Therefore, an SOI layer to be formed with semiconductor devices can be formed by thinning the bond wafer to a desired thickness by grinding and polishing. However, when thinning by polishing is performed to the ground surface, if stock removal is set much, there is an advantage that small micro-roughness of the polished surface is improved, however there is a problem that uniformity of film thickness of the SOI layer in the whole of the wafer is degraded. Therefore, settable stock removal has an upper limit.

Accordingly, as a method of improving micro-roughness without degrading uniformity of film thickness, there is a high temperature heat treatment at 1000° C. or more in a non-oxidizing atmosphere. The treatment has become an effective method for improving the micro-roughness.

Moreover, recently as a technology for producing a ultra thin SOI wafer having an SOI layer of thickness of 0.1 μm or less with good uniformity of film thickness, an ion implantation delamination method (which is also referred to as a smart cut (a registered trademark) method) has been noticed (see, Japanese Patent No. 3048201).

The ion implantation delamination method is a technology of, for example, forming an oxide film on a surface of at least one of two wafers, therewith implanting at least one of hydrogen ions and rare gas ions from a surface of a bond wafer to form a micro bubble layer (an inclusion layer) inside the bond wafer such as near the surface thereof, thereafter bringing the bond wafer into contact closely with a base wafer through an oxide film on the ion-implanted surface side thereof, thereafter performing a heat treatment (a delaminating heat treatment) to delaminate the bond wafer thin-filmily so that the micro bubble layer is a cleaved surface (a delaminating plane), and further performing a heat treatment (a bonding heat treatment) to bond two silicon wafers tightly to provide an SOI wafer.

The surface (the delaminated surface) of the SOI wafer produced as described above becomes comparatively good mirror surface. However further polishing referred to as "touch polishing" in which stock removal is very small, 100 nm or less, is performed so that the SOI wafer has surface roughness equal to a general mirror-polished wafer.

Moreover, there is known a technology that a high temperature heat treatment in an atmosphere of hydrogen or Ar is performed instead of or along with the touch polishing to reduce surface roughness of the SOI layer and crystal defects with maintaining uniformity of film thickness of the SOI layer immediately after the delamination (Japanese Patent Laid-open (Kokai) No. 11-307472).

If the above-described ion implantation delamination method is used, an SOI wafer having very high uniformity of film thickness of an SOI layer can be comparatively easily obtained, and furthermore there is an advantage that material can be effectively usable because the other delaminated wafer can be recycled. Moreover, this method can be used in the case that when producing a bonded wafer, silicon wafers are mutually bonded directly without being through an oxide film. As well as bonding silicon wafers, the method can be used in the case that an SOI wafer is produced by implanting ions into a silicon wafer and bonding the silicon wafer to an insulating base wafer such as quartz, silicon carbide, alumina, or diamond which are different from a silicon wafer in coefficient of expansion.

There is an MIS (Metal/Insulator/Silicon) type transistor, in a kind of devices formed in an SOI layer of an SOI wafer produced as described above. With respect to a gate insulator film thereof, high performance electrical characteristics such as a low leakage current characteristic, low interface trap density, and high carrier injection resistance, and high reliability are required. As a technology forming a gate insulator film (mainly a silicon oxide film) meeting these requirements, a thermal oxidation technology has been conventionally used that a heat treatment is performed at 800° C. or more by using oxygen molecules or water molecules.

By using the thermal oxidation technology, a silicon oxide film having good characteristics of oxide film/silicon interface, a breakdown voltage characteristic of the oxide film, and a low leakage current characteristic can be conventionally obtained in the case that a silicon wafer having a plain orientation of {100} or a silicon wafer having a plain orientation angled approximately at 4 degrees from {100}. This is caused because interface trap density of a gate oxide film formed in a {100} plane is low compared to a gate oxide film formed in other crystal plane. Namely, a silicon oxide film formed in a silicon wafer having a plain orientation other than {100} by using a thermal oxidation technology has a high interface trap density of oxide film/silicon interface, a bad breakdown voltage characteristic of the oxide film, and a bad leakage current characteristic. Thus, the oxide film is inferior in electrical characteristics.

Therefore as a silicon wafer formed with MIS type semiconductor devices represented by so-called MOS (Metal/Oxide/Silicon) type transistors, an wafer having a plain orientation of {100} or an wafer having a plain orientation angled approximately at 4 degrees from {100}, has been conventionally used.

However, in recent years, a technique has been developed that a good-quality oxide insulator film is formed regardless of a plain orientation of a silicon wafer surface by using $Kr/O_2$ plasma (see, for example, Saito et al., "Advantage of Radical Oxidation for Improving Reliability of Ultra-Thin Gate Oxide", 2000 Symposium on VLSI Technology, Honolulu, Hi., Jun. 13th-15th, 2000.). Namely, if the technique is used that a good-quality oxide insulator film regardless of a plain orientation of a silicon wafer is formed, it is not necessary to limit a plain orientation of a silicon wafer for forming MOS type semiconductor devices to {100}. A silicon wafer having a plain orientation having most suitable characteristics for any purpose is possibly used.

For example, it has been revealed that a carrier mobility in a channel direction of an MOSFET (MOS Field Effect Transistor) become twice or more in a specific direction of an wafer having a plain orientation of {110} for some cases, and that as a result, a current value between drain and source is increased.

Therefore, if by using a silicon single crystal wafer in which a plain orientation is a {110} plane as an wafer for fabricating MOS type devices, a gate insulator film is formed by the technique of forming an insulator film of good-quality regardless of a plain orientation as described above, there is possibility to fabricate MOS devices having an innovatively excellent characteristics such as high speed devices for which high carrier mobility is utilized.

Moreover, because the advantage of a {110} plane such as high carrier mobility as described above is the same in an SOI wafer, and originally an SOI wafer has most suitable characteristics for forming high speed and high performance devices, an SOI wafer having a plain orientation of an SOI layer of {110} has been demanded more and more in recent years.

DISCLOSURE OF THE INVENTION

However, in the case that a plain orientation of an SOI layer of an SOI wafer is exactly {110} i.e. just {110}, when a high temperature heat treatment is performed in non-oxidizing atmosphere for eliminating surface roughness or defects of the SOI layer, roughness derived from anisotropic etching is generated in the SOI layer surface to rather degrade micro-roughness. Therefore, in the case that a plain orientation of an SOI layer was just {110}, the roughness-improving treatment or defects-removing treatment by the above-described high temperature heat treatment could not be applied.

Therefore, in the case that an SOI wafer is produced by using a silicon single crystal wafer having a just {110} plain orientation as a bond wafer formed with an SOI layer, there must be performed a polishing treatment finally for a treatment adjusting thickness or surface roughness of the SOI layer. However, because uniformity of film thickness is degraded if polishing is performed until micro-roughness is sufficiently improved, only an SOI wafer with low quality as to uniformity of film thickness can be obtained.

Uniformity of film thickness is one of most important factors for producing devices formed in the SOI wafers with high uniformity of characteristics and with high productivity.

Therefore also as to an SOI wafer having an SOI layer of a plain orientation of {110} demanded more and more in accordance with requirements for high speed devices in recent years, a method has been desired for obtaining an SOI wafer in which uniformity of film thickness of an SOI layer is high and micro-roughness is improved.

The present invention solves the above-described problems. An object of the present invention is to provide an SOI wafer that can be formed with higher speed devices along with both high uniformity of film thickness and good micro-roughness, and a method of producing the SOI wafer.

In order to accomplish the above object, according to the present invention, there is provided an SOI wafer having at least an SOI layer, in which a plain orientation of the SOI layer is off-angled from {110} only in a direction to <100>, and an off-angle is from 5 minutes to 2 degrees.

As described above, a plain orientation of the SOI layer is off-angled from {110} only in a direction to <100>, and an off-angle is from 5 minutes to 2 degrees, thereby micro-roughness is not degraded but rather improved by a heat treatment in a non-oxidizing atmosphere to provide an SOI wafer having both high uniformity of film thickness and good micro-roughness.

It is preferable that the off-angle is from 30 minutes to one degree and 30 minutes.

If the off-angle is from 30 minutes to one degree and 30 minutes as described above, there can be provided an SOI wafer having high uniformity of film thickness and better micro-roughness.

Moreover, according to the present invention, there is provided a method of producing an SOI wafer comprising at least bonding a base wafer and a bond wafer consisting of a silicon single crystal, and forming an SOI layer by thinning the bond wafer, wherein the bond wafer is used where a plain orientation thereof is off-angled from {110} only in a direction to <100>, and an off-angle is from 5 minutes to 2 degrees.

As described above, in a method of producing an SOI wafer by a bonding method, the bond wafer is used where a plain orientation thereof is off-angled from {110} only in a direction to <100>, and an off-angle is from 5 minutes to 2 degrees, thereby to produce an SOI wafer having high uniformity of film thickness and good micro-roughness.

Furthermore, it is preferable that the obtained SOI wafer is further subjected to a heat treatment in a non-oxidizing atmosphere at a temperature from 1000° C. to 1350° C.

As described above, the SOI layer of the present invention is that roughness derived from anisotropic etching is not generated by performing a heat treatment in a non-oxidizing atmosphere, thereby to produce an SOI wafer in which improvement of roughness and reduction of crystal defects are sufficiently achieved.

Moreover, the bond wafer can be formed with an ion-implanted layer near a surface thereof by implanting at least one kind of hydrogen ions and rare gas ions from the surface, and after bonding the bond wafer and the base wafer, the bond wafer can be thinned by delaminating in the ion-implanted layer.

By performing a so-called ion implantation delamination method, which is that a bond wafer formed with an ion-implanted layer near a surface thereof by implanting at least one kind of hydrogen ions and rare gas ions from the surface is used and the bond wafer after bonding is thinned by delaminating in the ion-implanted layer as described above, there can be produced an ultra thin SOI wafer having a thickness of an SOI layer of 0.1 μm or less, and having high uniformity of film thickness so as to form high speed devices.

Moreover, it is preferable that the bond wafer and the base wafer are bonded through an insulator film.

By bonding the bond wafer and the base wafer consisting of, for example, silicon through an insulator film, there can be produced an SOI wafer of good bonding strength because the base wafer and the bond wafer consist of the same material. However, the present invention is not limited to this, for example, the bond wafer may be directly bonded to a insulating base wafer.

Moreover, it is preferable that the bond wafer where the off-angle is from 30 minutes to one degree and 30 minutes is used in the above-described producing method.

By using a bond wafer where the off-angle is from 30 minutes to one degree and 30 minutes as described above, there can be produced an SOI wafer having high uniformity of film thickness and better micro-roughness.

As explained above, a plain orientation of an SOI layer is off-angled from {110} only in a direction to <100>, and an off-angle is from 5 minutes to 2 degrees, thereby there can be provided an SOI wafer excellent in uniformity of film thickness of the SOI layer as well as micro-roughness, and suitable for forming high speed devices for which high carrier mobility is utilized, and such.

Particularly, if the off-angle is from 30 minutes to one degree and 30 minutes, micro-roughness becomes better.

Moreover, the off-angled SOI layer as described above is formed by an ion implantation delamination method, thereby there can be produced a ultra thin SOI wafer with a thickness of an SOI layer of 0.1 μm or less and with high uniformity of thickness.

Particularly, by further subjecting the obtained SOI wafer to a heat treatment in a non-oxidizing atmosphere at a temperature from 1000° C. to 1350° C. as described above, it is possible to produce an SOI wafer in which surface roughness and crystal defects are reduced.

BEST MODE FOR CARRYING OUT THE INVENTION

Figure 1:
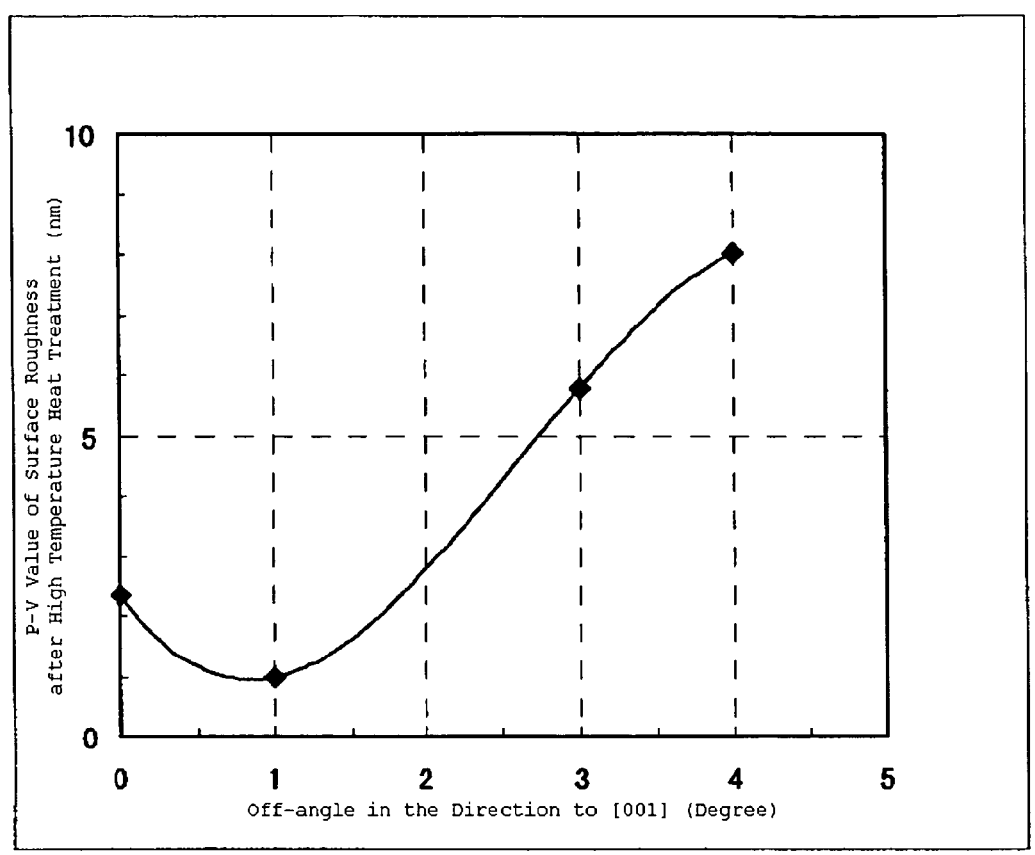
FIG. 1 is a graph illustrating a relation between an off-angle and a P-V value of surface roughness after a high temperature heat treatment in Example and Comparative Example of the present invention.

Hereinafter, embodiments of the present invention will now be described. However, the present invention is not limited thereto.

In the present invention, crystal plane and crystal orientation is represented by using Miller indices. For example, {100} denotes a generic representation of crystal planes such as (100), (010), and (001). And <100> denotes a generic representation of crystal orientations such as [100], [010], and [001].

Conventionally, in the case that an SOI wafer having an SOI layer of a plain orientation of {110} is produced, first a silicon single crystal ingot of crystal orientation of <110> is pulled, next the crystal orientation of the ingot is precisely measured by using an X-ray orientation-measuring equipment (angle resolution of about one minute), and the ingot is sliced so that a plain orientation is just {110}, thereby to produce a bond wafer for forming an SOI layer.

In the case that bond wafers sliced so that a plain orientation is just {110} are produced at a mass production level, it is general that bond wafers having angle disagreement of less than about ±5 minutes are actually contained even if sliced so as to be just-angled. On the other hand, there is a case that angle disagreement of up to about ±30 minutes is allowed as specifications of required production wafers. In such a case, because an wafer having angle disagreement of about ±30 minutes or less meets requested specifications, such a wafer is treated as having a plain orientation of just {110}.

However, because there are little or no cases of production specifications such that angle disagreement of about ±30 minutes or more is allowed as being just {110}, an wafer having such angle disagreement can be regard as an wafer sliced so as to be intentionally angled from {110}. An wafer produced so that the slicing direction is intentionally, angled from one characteristic orientation is referred to as an off-angled wafer, and an angle of the tilt is referred as an off-angle.

The present inventors produced an SOI wafer with an SOI layer of a plane orientation of just {110} by the ion implantation delamination method, and subjected the SOI wafer to a high temperature heat treatment in inert gas (argon gas) with the object of improvement of SOI surface roughness after touch polishing and removal of defects. Thereby, there was confirmed the tendency that roughness of the SOI wafer surface was rather degraded. And as a result of further investigations, the present inventors found that the roughness after the heat treatment is related to an off-angle of a bond wafer, and thereby the present invention was accomplished.

Concretely, when slicing a silicon wafer with an off-angled plain orientation from {110} from a silicon single crystal ingot for use as an SOI layer of an SOI wafer, if making an off-angle from {110} only in a direction to <100> so that the off-angle is in the range from 5 minutes to 2 degrees, improvement effect of surface roughness can be obtained at least by the high temperature heat treatment as described above, and also the object of defect removal can be accomplished.

The off-angle is preferred to be from 30 minutes to one degree and 30 minutes, and particularly to be about one degree (within ±5 minutes).

The above-described SOI wafer can be produced by steps described as follows. First by Czochralski method (CZ method), a silicon single crystal ingot having a crystal orientation of <110> is grown by using a seed crystal of a crystal orientation of <110>. Next, when slicing bond wafers for forming SOI layers from the above-described grown silicon single crystal ingot, an off-angle is made from {110} only in a direction to <100> so that the off-angle is in the range from 5 minutes to 2 degrees. In this case, a seed crystal for use may have a desired off-angle in advance, and the grown CZ silicon single crystal ingot may be sliced perpendicularly to the growing axis direction. Thereby slicing process yield from an ingot can be improved.

Next, at least one of hydrogen ions and rare gas ions are implanted at desired acceleration energy and dose amount directly from a surface of the bond wafer, or through an insulator film such as a silicon oxide film after forming it on the surface of the wafer. A micro bubble layer is formed near the bond wafer surface by the thus-implanted ions. The bond wafer is brought into contact closely with a base wafer in the ion-implanted surface side through a silicon oxide film and so on. Thereafter by performing a heat treatment at a comparatively low temperature of about 500° C. or more (a delaminating heat treatment), the bond wafer is delaminated in the micro bubble layer by pressure of the micro bubble and action of crystal rearrangement. Next, a heat treatment in an oxidizing atmosphere at a temperature of about 1000-1200° C. to enhance bonding strength between the wafers. In addition, in the case a silicon single crystal wafer is used as a base wafer, an wafer having a plain orientation different from {110} (such as {100}) is preferred to use because bow generated frequently by a high temperature heat treatment can be suppressed.

In addition, a way of thinning of the bond wafer is not limited to the ion implantation delamination method as described above, and it is possible to apply the conventional methods such as grinding, polishing and etching to the thinning.

Moreover, the obtained SOI wafer is subjected to touch polishing and to a high temperature heat treatment in an Ar atmosphere at about 1000° C.-1350° C. Thereby there can be produced an SOI wafer in which uniformity of film thickness inside the wafer is high, micro-roughness is also good, and crystal defects are also reduced. In the case, because a plain orientation of the SOI layer is off-angled from {110} only in a direction to <100>, and the off-angle is from 5 minutes to 2 degrees in the present invention, micro-roughness is not degraded but rather improved by a heat treatment in a non-oxidizing atmosphere. And with respect to touch polishing performed before the high temperature heat treatment, stock removal can be made small compared to a general case, or only the high temperature treatment can be performed without touch polishing.

The SOI wafer obtained as described above is very thin, high uniformity of film thickness, and good micro-roughness as described above. Therewith, the plain orientation of the SOI layer is slightly off-angled from {110}. Therefore, the SOI wafer has very high carrier mobility so as to be very preferable for forming high speed devices.

Hereinafter, the present invention will be explained in reference to Example and Comparative Examples, however, the present invention is not limited thereto.

EXAMPLE AND COMPARATIVE EXAMPLES

A silicon single crystal ingot having a crystal orientation of <110> was pulled by Czochralski method. By slicing the ingot, an off-angled bond wafer having a diameter of 200 mm, of which a plane orientation was off-angled at only one degree from (110) only in a direction to [100], was produced as Example of the present invention. And, nine kinds of bond wafers sliced so as to have different plain orientations from the present invention as Comparative Examples were produced.

By using these bond wafers, the wafers were thinned by the ion implantation delamination method comprising implanting hydrogen ions to form ion-implanted layers and delaminating the wafers in the ion-implanted layers, thereby to produce SOI wafers having high uniformity of film thickness, thereafter these SOI wafers were subjected to a heat treatment at 1200° C. for one hour in an atmosphere of 100% Argon for reducing crystal defects. After the heat treatment, micro-roughness of SOI layer surfaces was measured by AFM (Atomic Force Microscope). The micro-roughness measurement by AFM was performed to the range of 1×1 μm at the center of the SOI wafer.

In addition, the condition of producing SOI wafers is as follows.

base wafer: (100) silicon single crystal wafer buried oxide film: formed by 200 nm on the bond wafer condition of the ion implantation: $H^+$ ions, 50 keV, $6 \times 10^{16}$ atoms/cm$^2$ heat treatment for delamination: at 500° C. for 30 minutes in an Argon atmosphere a heat treatment for bonding: at 1100° C. for 2 hours in an oxidizing atmosphere touch polishing: polishing by about 100 nm P-V (Peak to Valley) values and RMS (Root Mean Square) values of surface roughness measured as described above are summarized in Table 1.

SOI wafers of Comparative Examples 1 and 2 are that off-angles are 1 degree and 3 degrees only in a direction to [110], respectively. SOI wafers of Comparative Examples 3 and 4 are that off-angles are 1 degree and 3 degrees only in a direction to [112], respectively. And, SOI wafers of Comparative Examples 5 and 6 are that off-angles are 1 degree and 3 degrees only in a direction to [111], respectively. These wafers are different from the present invention in a direction of an off-angle. On the other hand, Comparative Examples 7 and 8 are that directions of off-angles are [001] direction, the same as that of Exmaple of the present invention, however off-angles are 3 degrees and 4 degrees, respectively. And Comparative Example 9 is a sample produced so as to have just (110) plain orientation. However, the sample occasionally has a slight disagreement of angle generally as described above, and in the case of Comparative Example 9, the angle disagreement is within ±2 minutes.

TABLE 1

| Kinds of samples | Setting of off-angle | | Result of roughness measurement | |
|---|---|---|---|---|
| | Direction | Angle | P-V value[nm] | RMS value[nm] |
| Comparative Example 1 | Only to [110] | 1° | 3.7 | 0.51 |
| Comparative Example 2 | Only to [110] | 3° | 3.0 | 0.44 |
| Comparative Example 3 | Only to [112] | 1° | 3.1 | 0.53 |
| Comparative Example 4 | Only to [112] | 3° | 4.8 | 0.93 |
| Comparative Example 5 | Only to [111] | 1° | 3.1 | 0.57 |
| Comparative Example 6 | Only to [111] | 3° | 4.0 | 0.74 |
| Example | Only to [001] | 1° | 0.99 | 0.11 |
| Comparative Example 7 | Only to [001] | 3° | 5.7 | 0.93 |
| Comparative Example 8 | Only to [001] | 4° | 8.0 | 0.97 |
| Comparative Example 9 | Just | Within ±2' | 2.3 | 0.37 |

As shown in Table 1, according to Example, regarding roughness of the SOI wafer having an off-angle of one degree only in the direction to [001], the P-V value was 0.99 nm and the RMS value was 0.11 nm, so the obtained values were better compared to those of Comparative Examples.

Hereinafter, for comparing Examples to Comparative Examples more in detail, the data shown in Table 1 will be graphed to explain them.

Figure 2:
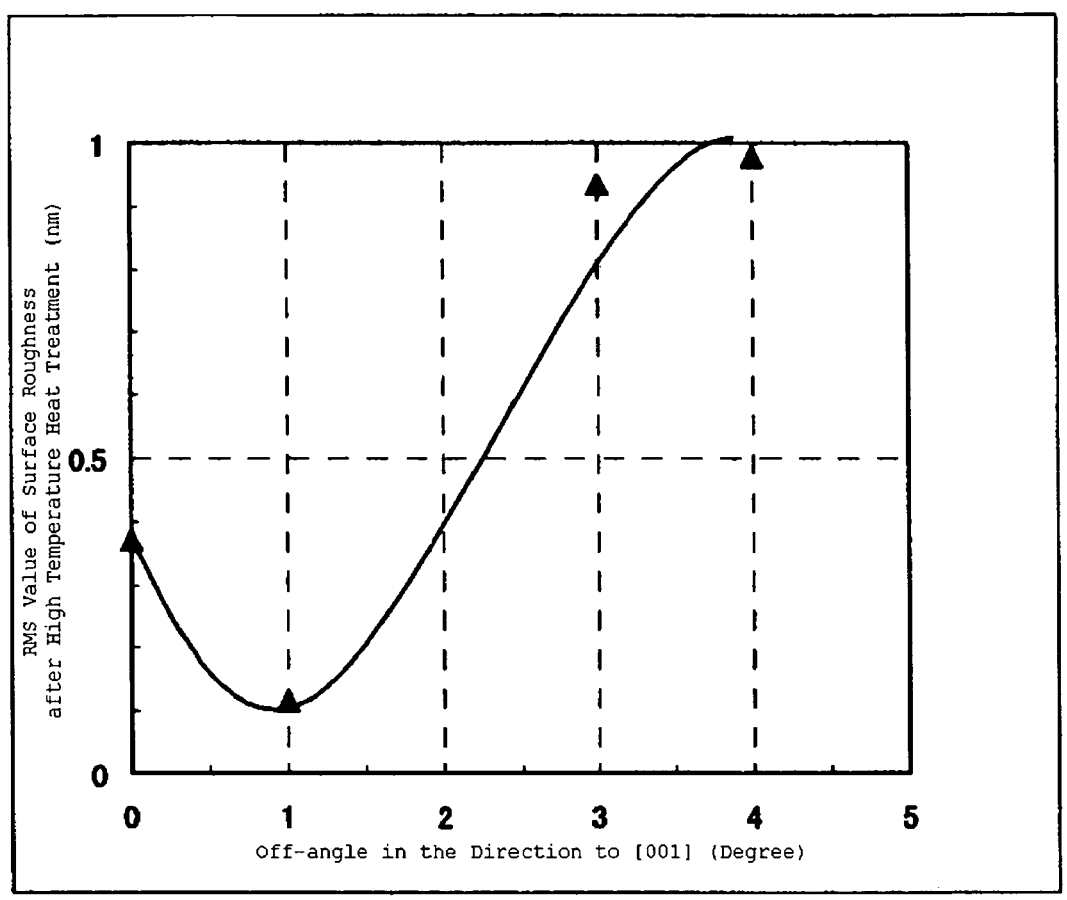
FIG. 2 is a graph illustrating a relation between an off-angle and a RMS value of surface roughness after a high temperature heat treatment in Example and Comparative Example of the present invention.

FIGS. 1 and 2 are graphs illustrating relations between P-V values or RMS values and off-angles only in the direction to [001]. For example, when RMS values are compared, the RMS value in the off-angle of one degree was 0.11 nm, which was ⅓ or less compared to the RMS value of 0.37 nm in the just (110) plain orientation in Comparative Example 9, and was about ⅑ compared to the RMS value of 0.93 nm in the off-angle of 3 degrees in Comparative Example 7. From the figures, it can be confirmed that after performing the high temperature heat treatment, both P-V value and RMS value show good values that are not degraded but equivalent or better compared to SOI surface roughness of just (110) samples in the case that the off-angle is 2 degrees or less. Particularly in the case that the off-angle is from 30 minutes to 1 degree and 30 minutes, the values become smallest.

Figure 3:
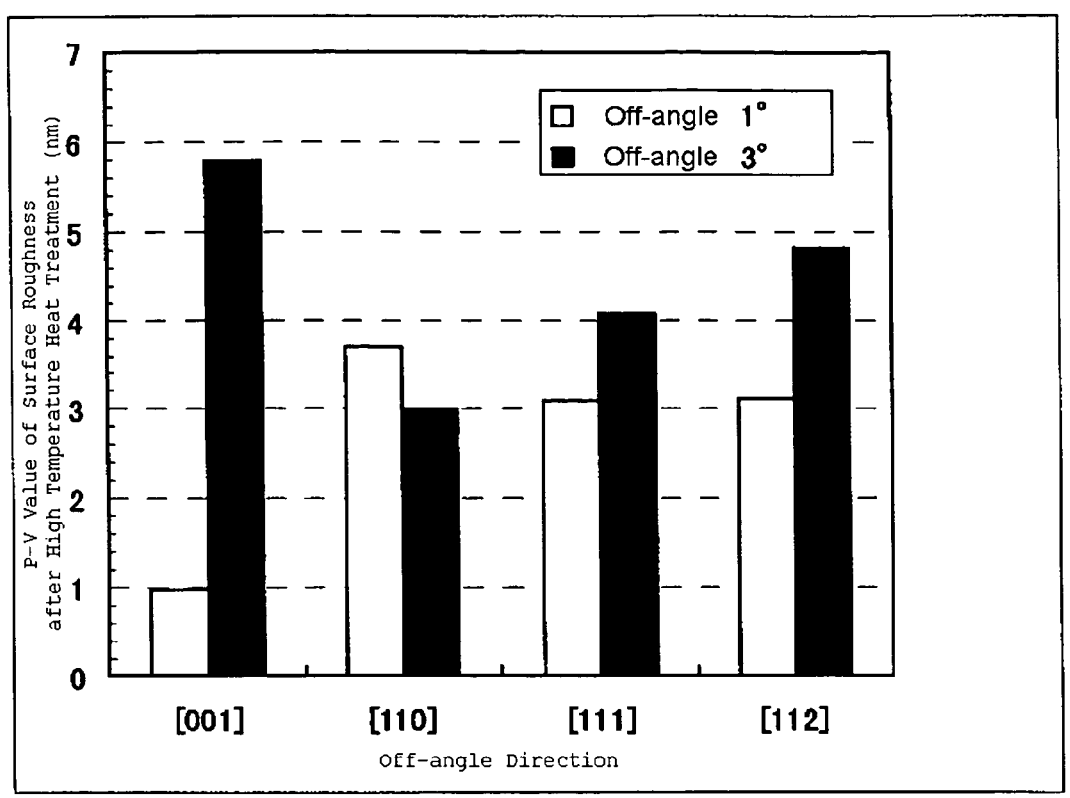
FIG. 3 is a graph illustrating a relation between an off-angle direction and a P-V value of surface roughness after a high temperature heat treatment in Example and Comparative Example of the present invention.
Figure 4:
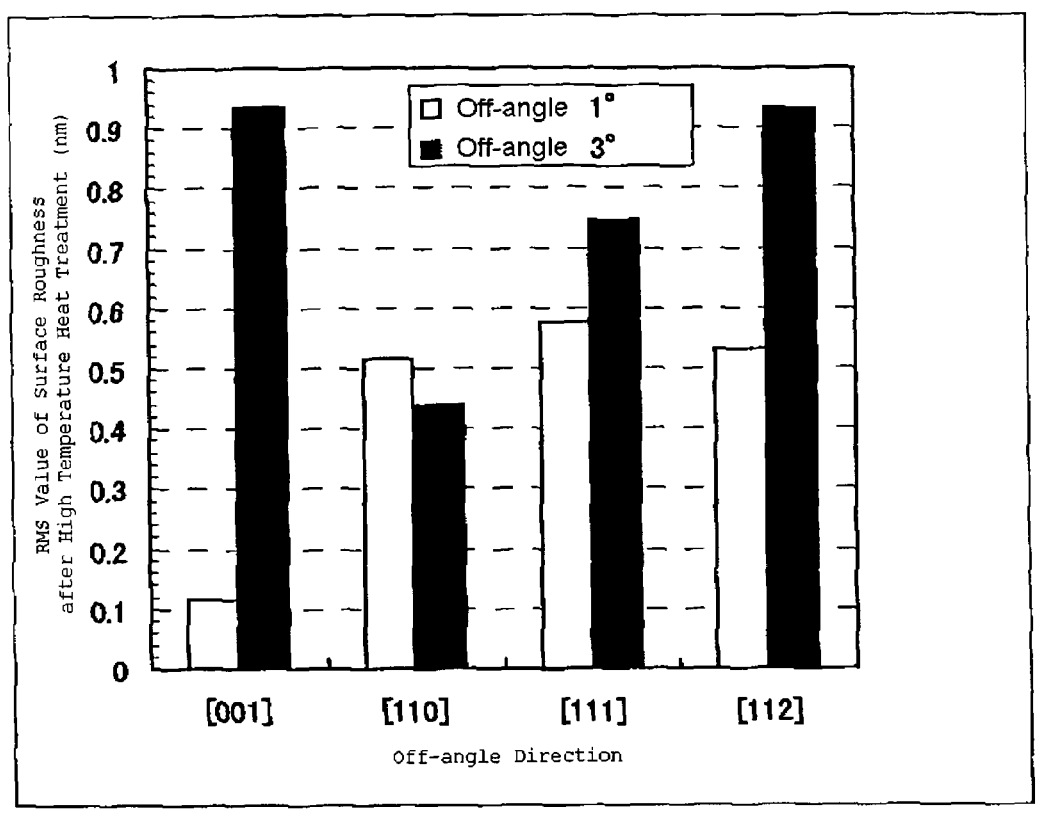
FIG. 4 is a graph illustrating a relation between an off-angle direction and a RMS value of surface roughness after a high temperature heat treatment in Example and Comparative Example of the present invention.

Next, FIGS. 3 and 4 are graphs illustrating relations between P-V values or RMS values and directions of off-angles as to the cases that off-angles are one degree and three degrees. For example, when RMS values in the cases of off-angle of one degree are compared, the RMS value for the off-angle of only in the direction to [001] was 0.11 nm, which was about ⅕ compared to the RMS values of 0.51 nm, 0.53 nm, and 0.57 nm in the cases that off-angle directions are only to [110], only to [112], and only to [111] according to Comparative Examples 1, 3, and 5, respectively. From these figures, it can be confirmed that after performing the high temperature heat treatment, SOI surface roughness shows good values that are equivalent or better compared to SOI surface roughness of just (110) samples in the case that off-angle is formed only in the direction to [001].

Accordingly, from results shown in FIGS. 1-4, it can be confirmed that after performing the high temperature heat treatment, SOI surface roughness is not degraded but shows good values in the case that off-angle is formed only in the direction to [001] and the angle is about 2 degrees or less according to the present invention.

The present invention is not limited to the embodiments described above. The above-described embodiments were mere examples, and those having the substantially same constitution as that described in the appended claims and providing the similar working effects are included in the scope of the present invention.

For example, the silicon single crystal wafer having a plain orientation of (100) was used for a base wafer in Example, however a plain orientation is not limited to (100), and material of the base wafer is not limited to silicon but insulating material such as quartz, nitrogen carbide, alumina, or diamond can be used.

Moreover, in the case of forming an oxide film, the base wafer can be formed with an oxide film, or both the bond wafer and the base wafer can be formed with oxide films.

Moreover, diameter of each wafer is not limited to 200 mm, and can be 200 mm or less, large diameter of 200 mm or more can further improve productivity of devices.

Moreover, the method of pulling a silicon single crystal ingot was performed by CZ method, however also can be performed by magnetic field applied CZ method.

The invention claimed is:

1. An SOI wafer having at least an SOI layer, in which a plain orientation of the SOI layer is off-angled from {110} only in a direction to <100>, and an off-angle is from 5 minutes to 2 degrees.

2. The SOI wafer according to claim 1, wherein the off-angle is from 30 minutes to one degree and 30 minutes.

3. A method of producing an SOI wafer comprising at least bonding a base wafer and a bond wafer consisting of a silicon single crystal, and forming an SOI layer by thinning the bond wafer, wherein the bond wafer is used where a plain orientation thereof is off-angled from {110} only in a direction to <100>, and an off-angle is from 5 minutes to 2 degrees.

4. The method of producing an SOI wafer according to claim 3, wherein the obtained SOI wafer is further subjected to a heat treatment in a non-oxidizing atmosphere at a temperature from 1000° C. to 1350° C.

5. The method of producing an SOI wafer according to claim 4, wherein the bond wafer is formed with an ion-implanted layer near a surface thereof by implanting at least one kind of hydrogen ions and rare gas ions from the surface, and after bonding the bond wafer and the base wafer, the bond wafer is thinned by delaminating in the ion-implanted layer.

6. The method of producing an SOI wafer according to claim 5, wherein the bond wafer and the base wafer are bonded through an insulator film.

7. The method of producing an SOI wafer according to claim 6, wherein the bond wafer where the off-angle is from 30 minutes to one degree and 30 minutes is used.

8. The method of producing an SOI wafer according to claim 5, wherein the bond wafer where the off-angle is from 30 minutes to one degree and 30 minutes is used.

9. The method of producing an SOI wafer according to claim 4, wherein the bond wafer and the base wafer are bonded through an insulator film.

10. The method of producing an SOI wafer according to claim 9, wherein the bond wafer where the off-angle is from 30 minutes to one degree and 30 minutes is used.

11. The method of producing an SOI wafer according to claim 4, wherein the bond wafer where the off-angle is from 30 minutes to one degree and 30 minutes is used.

12. The method of producing an SOI wafer according to claim 3, wherein the bond wafer is formed with an ion-implanted layer near a surface thereof by implanting at least one kind of hydrogen ions and rare gas ions from the surface, and after bonding the bond wafer and the base wafer, the bond wafer is thinned by delaminating in the ion-implanted layer.

13. The method of producing an SOI wafer according to claim 12, wherein the bond wafer and the base wafer are bonded through an insulator film.

14. The method of producing an SOI wafer according to claim 13, wherein the bond wafer where the off-angle is from 30 minutes to one degree and 30 minutes is used.

15. The method of producing an SOI wafer according to claim 12, wherein the bond wafer where the off-angle is from 30 minutes to one degree and 30 minutes is used.

16. The method of producing an SOI wafer according to claim 3, wherein the bond wafer and the base wafer are bonded through an insulator film.

17. The method of producing an SOI wafer according to claim 16, wherein the bond wafer where the off-angle is from 30 minutes to one degree and 30 minutes is used.

18. The method of producing an SOI wafer according to claim 3, wherein the bond wafer where the off-angle is from 30 minutes to one degree and 30 minutes is used.

* * * * *